(12) United States Patent
Kenworthy et al.

(10) Patent No.: US 8,128,750 B2
(45) Date of Patent: Mar. 6, 2012

(54) ALUMINUM-PLATED COMPONENTS OF SEMICONDUCTOR MATERIAL PROCESSING APPARATUSES AND METHODS OF MANUFACTURING THE COMPONENTS

(75) Inventors: Ian J. Kenworthy, Mountain View, CA (US); Kelly W. Fong, San Mateo, CA (US); Leonard J. Sharpless, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 1000 days.

(21) Appl. No.: 11/730,049

(22) Filed: Mar. 29, 2007

(65) Prior Publication Data
US 2008/0241517 A1 Oct. 2, 2008

(51) Int. Cl.
*C23C 16/00* (2006.01)
*C23C 14/00* (2006.01)

(52) U.S. Cl. .......................... 118/715; 118/50

(58) Field of Classification Search .................. 118/715
See application file for complete search history.

(56) References Cited

U.S. PATENT DOCUMENTS

| | | | |
|---|---|---|---|
| 4,032,413 A | 6/1977 | Dotzer et al. |
| 4,144,140 A | 3/1979 | Dötzer et al. |
| 4,892,857 A | 1/1990 | Tennent et al. |
| 5,007,991 A | 4/1991 | Lehmkuhl et al. |
| 5,091,063 A | 2/1992 | Lehmkuhl et al. |
| 5,641,375 A | 6/1997 | Nitescu et al. |
| 6,010,774 A | 1/2000 | Kadokura et al. |
| 6,207,036 B1 | 3/2001 | de Vries |
| 6,521,046 B2 | 2/2003 | Tanaka et al. |
| 2004/0173468 A1 | 9/2004 | Henuset |
| 2005/0284573 A1 | 12/2005 | Egley et al. |

FOREIGN PATENT DOCUMENTS

| | | | |
|---|---|---|---|
| JP | 10-088271 | * | 7/1998 |
| KR | 10-1999-0085248 A | | 12/1999 |

OTHER PUBLICATIONS

English translation of JP 10-088271, Toshiharu, Jul. 1998.*
Spring quarterly newsletter '96, AlumiPlate, http://www.alumiplate.com/assets/images/newslet1.pdf.*
J. Fischer, B. Fuhr, "Aluminum plating replaces cadmium," *Advanced Materials & Processes*, vol. 155, No. 4, Apr. 1999.
"AlumiPlate Begins Production Plating with Aluminum," *Aluminations*, The Quarterly Newsletter of AlumiPlate, Inc., vol. 2.1, Spring 1996 (3 pages).
"Applications for AlumiPlate™ Electrodeposited Aluminum," <http://www.alumiplate.com/html/body_applications.html>, retrieved Apr. 26, 2007.
"The Properties and Benefits of the AlumiPlate™ Electrodeposited Aluminum Coating," <http://www.alumiplate.com/html/body_properties.html>, retrieved Apr. 26, 2007.

* cited by examiner

*Primary Examiner* — Keath Chen
(74) *Attorney, Agent, or Firm* — Buchanan, Ingersoll & Rooney PC (57) ABSTRACT

Aluminum-plated components of semiconductor material processing apparatuses are disclosed. The components include a substrate and an optional intermediate layer formed on at least one surface of the substrate. The intermediate layer includes at least one surface. An aluminum plating is formed on the substrate, or on the optional intermediate layer. The surface on which the aluminum plating is formed is electrically-conductive. An anodized layer can optionally be formed on the aluminum plating. The aluminum plating or optional the anodized layer comprises a process-exposed surface of the component. Semiconductor material processing apparatuses including one or more aluminum-plated components, methods of processing substrates, and methods of making the aluminum-plated components are also disclosed.

16 Claims, 3 Drawing Sheets

ALUMINUM-PLATED COMPONENTS OF SEMICONDUCTOR MATERIAL PROCESSING APPARATUSES AND METHODS OF MANUFACTURING THE COMPONENTS

BACKGROUND

In the field of semiconductor material processing, semiconductor material processing apparatuses including vacuum processing chambers are used, for example, for etching and chemical vapor deposition (CVD) of various materials on substrates, and for resist stripping. Some of these processes utilize corrosive and erosive process gases and plasma in such processing chambers. It is desirable to minimize particle and/or metal contamination of substrates processed in the chambers. Accordingly, it is desirable that plasma-exposed components of such apparatuses be resistant to wear when exposed to such gases and plasma.

SUMMARY

An exemplary embodiment of an aluminum-plated component of a semiconductor material processing apparatus comprises a substrate including at least a first surface; an optional intermediate layer on at least the first surface of the substrate, the intermediate layer including at least a second surface; a high-purity, electrodeposited aluminum plating on the first surface of the substrate or on the second surface of the optional intermediate layer, the aluminum plating comprising, in wt. %, at least 99.00% Al and/or ≦0.10% total transition elements, wherein the first surface or the second surface on which the aluminum plating is disposed is an electrically-conductive surface, and the aluminum plating comprises a process-exposed outer surface of the component.

Another exemplary embodiment of an aluminum-plated component of a semiconductor material processing apparatus comprises a substrate including at least a first surface; an optional intermediate layer on at least the first surface of the substrate, the intermediate layer including at least a second surface; a high-purity, aluminum plating on the first surface of the substrate or on the second surface of the optional intermediate layer, wherein the first surface or the second surface on which the aluminum plating is disposed is an electrically-conductive surface; and an anodized layer formed on the aluminum plating, the anodized layer comprising a process-exposed outer surface of the component.

An exemplary embodiment of a method of making an aluminum-plated component of a semiconductor material processing apparatus comprises optionally forming an intermediate layer on at least a first surface of a substrate, the intermediate layer including at least a second surface; electrodepositing a high-purity, aluminum plating on the first surface of the substrate or on the second surface of the optional intermediate layer, wherein the first surface of the substrate or the second surface of the intermediate layer on which the aluminum plating is formed is an electrically-conductive surface, the aluminum plating comprising an outer surface of the component; and optionally forming an anodized layer on the aluminum plating, the anodized layer covering the outer surface of the aluminum plating and comprising a process-exposed outer surface of the component.

DETAILED DESCRIPTION

Components of semiconductor material processing apparatuses, methods of making the components, and methods of processing semiconductor materials in processing chambers including one or more of the components are described herein. The components comprise a wear-resistant outer surface that resists wear when the components are used in a plasma processing chamber of a semiconductor material processing apparatus. As used herein, the term "wear resistant" includes resistance to physical and/or chemical attack, such as can be caused by corrosion, erosion and/or corrosion-erosion of process-exposed surfaces.

The components comprise a substrate and a wear-resistant coating on at least one surface of the substrate. The substrate "surface" that is coated can be an exterior surface, or an interior surface that defines a hole, cavity or aperture. The coating can be applied on one or more, or on all, exterior surfaces of the components. The wear-resistant coatings can cover the entire exterior surface of components. The coatings can also be applied on one or more, or on all, accessible interior surfaces of the components.

The wear-resistant coatings comprise an aluminum plating. In some embodiments, the aluminum plating comprises a process-exposed surface of the component. In other embodiments, an anodized layer is formed on the aluminum plating and comprises a process-exposed surface of the component.

In semiconductor material processing apparatuses, process-exposed (or "process-wetted") surfaces of components are exposed to one or more of process gases, plasma and reactive species. Energetic ions, radicals, photons and various neutral atoms and molecules are generated by plasma discharge, and various chemical reactions occur in the processing of semiconductor substrates. Some embodiments of the components including a wear-resistant coating can be used in resist stripping chambers in which one or more process-exposed surfaces of the components are exposed to reactive species of a remotely-generated plasma. Other embodiments of the components including a wear-resistant coating can be used in plasma reactors and vacuum chambers (e.g., chemical vapor deposition (CVD) and physical vapor deposition (PVD) chambers) in which one or more process-exposed surfaces of the components are exposed to process gas and/or plasma. The wear-resistant coatings on the components provide resistance to chemical (corrosive) and/or physical attack of the process-exposed surfaces of the components in these apparatuses.

Components including a wear-resistant coating can be used in apparatuses for performing various processes including plasma etching of semiconductor substrates, process chamber cleaning, conditioning, deposition of materials (e.g., CVD, PVD, PECVD and the like), or resist stripping processes (e.g., using an upstream plasma source) used for manufacturing various substrates including, e.g., semiconductor wafers, flat panel display substrates and the like. Depending on the type and construction of an apparatus, the parts can be, e.g., chamber walls, chamber liners, substrate supports, baffles (e.g., provided in showerhead electrode assemblies above the showerhead electrode), gas distribution plates, gas distribution rings, chucking mechanisms (e.g., electrostatic chucks), focus rings for substrate supports, gas nozzles, fasteners, heating elements, plasma screens and the like. The parts can include one or more exterior and/or interior surfaces coated with a wear-resistant coating. In some embodiments, the entire exterior surface of components can be coated.

Figure 1:
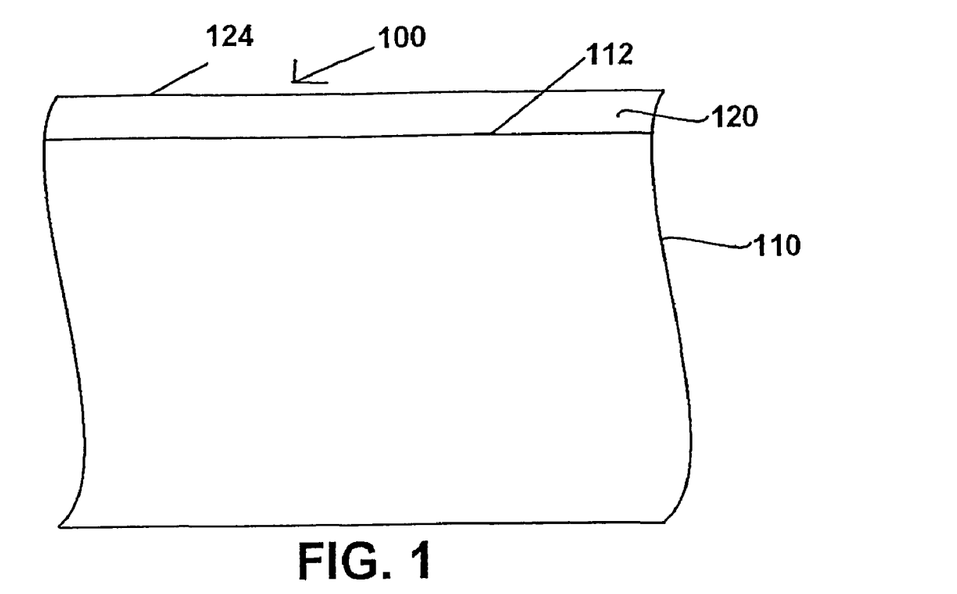
FIG. 1 illustrates an exemplary embodiment of an aluminum-plated component comprising a substrate and aluminum plating on a surface of the substrate and comprising a process-exposed outer surface of the component.

An aluminum-plated component 100 according to an exemplary embodiment is shown in FIG. 1. As shown, the component 100 comprises a substrate 110 including a surface 112 and a wear-resistant coating 120 formed on the surface 112. In the embodiment, the wear-resistant coating 120 is an aluminum plating comprising an outer surface 124 of the component 100. The substrate 110 comprises an electrically-conductive material. The electrically-conductive material can be a metallic material (i.e., a pure metal or an alloy); or a non-metallic material that has sufficient electrical conductivity to be electroplated, such as graphite, an electrically-conductive ceramic material, or an electrically-conductive polymeric material. Exemplary metals that can used to form the substrate 110 include steels (e.g., stainless steels); aluminum and aluminum alloys (e.g., Al 6061); refractory metals, such as hafnium, zirconium, titanium, niobium, tungsten, molybdenum, and alloys thereof; transition metals, such as nickel, iron, cobalt, and alloys thereof; and other metallic materials. The aluminum alloys can be wrought or cast. Exemplary electrically-conductive ceramic materials that can be used to make the substrate 110 include SiC and $TiO_2$. Exemplary polymeric materials that can be used to make the substrate 110 include conductive-particle-filled polymers, such as carbon particle filled polymers.

The substrate 110 of the aluminum-plated component 100 can be manufactured, e.g., by casting or hot working a metallic material, or sintering a metallic material Ceramic substrates can be made, e.g., by preparing a slurry of the ceramic material, and forming a green body from the slurry in a desired shape, such as by a compaction technique. The green compact is preferably formed in the shape of the component.

Figure 2:
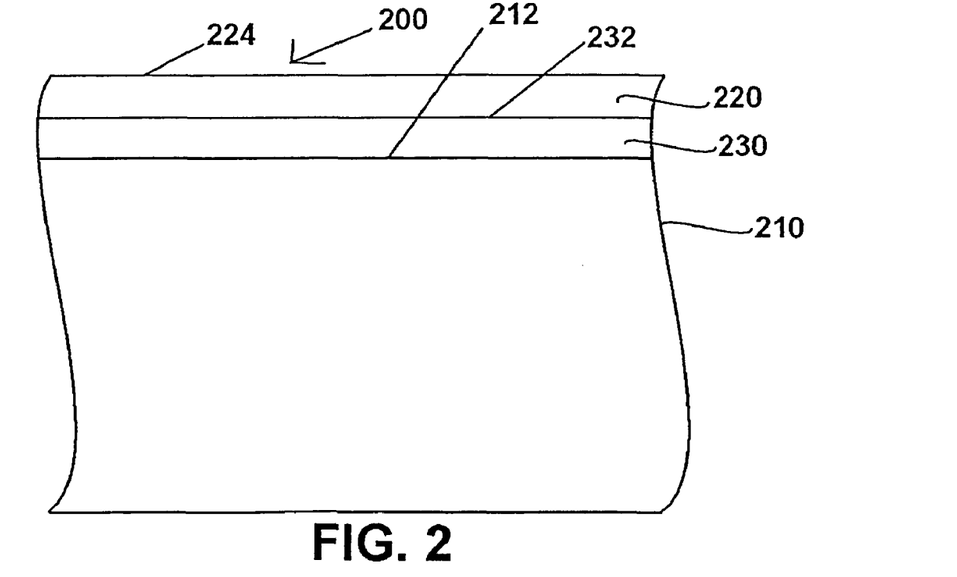
FIG. 2 illustrates another exemplary embodiment of an aluminum-plated component comprising a substrate, an intermediate layer on the substrate and an aluminum plating on the intermediate layer and comprising a process-exposed outer surface of the component.

An aluminum-plated component 200 according to another exemplary embodiment is shown in FIG. 2. The illustrated component 200 comprises a substrate 210 having a surface 212, an intermediate layer 230 formed on the surface 212, and a wear-resistant coating 220 formed on a surface 232 of the intermediate layer 230. The wear-resistant coating 220 comprises an aluminum plating comprising an outer surface 224 of the component 200. The substrate 210 can be an electrically-conductive material (e.g., a metal, electrically-conductive ceramic or electrically-conductive polymer), or a material that does not have sufficient electrical conductivity to allow the wear-resistant coating 220 to be formed satisfactorily on the surface 212 of the substrate 210 by electroplating (e.g., an electrical insulator, such as quartz or alumina).

The intermediate layer 230 is an electrically-conductive material (e.g., a metal, electrically-conductive ceramic or electrically-conductive polymer), which adheres to the surface 212 and allows the wear-resistant coating 220 to be formed over the substrate 210 when made of a material that has insufficient electrical conductivity to be electroplated. The intermediate layer 230 can also be applied to enhance the adhesive bonding strength of the wear resistant-coating 220 to embodiments of the substrate 210 that comprise an electrically-conductive material, where the aluminum plating forms a stronger bond to the material of the intermediate layer 230 than to the material of the substrate 210. The intermediate layer 230 can be formed on the surface 212 of substrate 210 by any suitable process, such as thermal spraying, electroless plating or electroplating, or a deposition process, such as CVD. The intermediate layer 230 is preferably formed on the entire surface 212 of the substrate 210 over which the wear-resistant coating 220 is formed.

Figure 3:
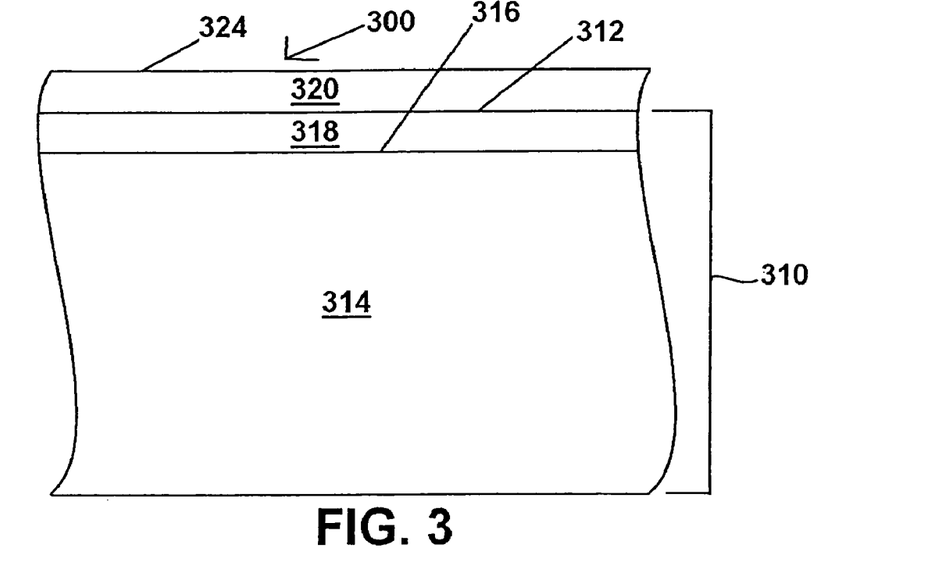
FIG. 3 illustrates another exemplary embodiment of an aluminum-plated component comprising a substrate including a base portion and an outer portion integral with the base portion, and an aluminum plating on the outer portion of the substrate and comprising a process-exposed outer surface of the component.

An aluminum-plated component 300 according to another exemplary embodiment is shown in FIG. 3. The illustrated component 300 comprises a substrate 310 including a base portion 314 and an outer portion 318 of a metal integral with the base portion 314. A wear-resistant coating 320 is formed on a surface 312 of the outer portion 318 of the substrate 310. In the embodiment, the wear-resistant coating 320 comprises an aluminum plating comprising an outer surface 324 of the component 300.

The base portion 314 of the substrate 310 comprises a mixture of at least one ceramic material and at least one metal oxide. The ceramic material can be, e.g., alumina ($Al_2O_3$), quartz, zirconia ($ZrO_2$), silicon carbide (SiC), silicon nitride ($Si_3N_4$), boron carbide ($B_4C$), boron nitride (BN), titania ($TiO_2$), aluminum nitride (AlN), yttria ($Y_2O_3$) and mixtures thereof. The metal oxide can be, e.g., a transition metal oxide, such as copper, cobalt, zinc, nickel and the like.

In the embodiment, the mixture of the ceramic material and metal oxide is formed into a body having a desired shape. The shaped body is thermally processed to cause the metal oxide to diffuse to external surfaces of the body. The metal oxide on the surface of the body is reduced in a hydrogen-containing atmosphere to produce the layer of metal 318 on the surface 316 of the base portion 314. The metal provides an electrically-conductive surface on which the wear-resistant coating 320 is formed.

In the exemplary components 100, 200, 300, the aluminum plating forming the wear-resistant coatings 120, 220, 320 is a high-purity material. Preferably, the aluminum plating comprises at least about 99.00 wt. % aluminum, more preferably at least about 99.99 wt. % aluminum, such as >99.999 wt. % aluminum. The aluminum plating can comprise, in weight percent, one or more of the following elements: ≦0.10% Cu, ≦0.10% Mg, ≦0.015% Mn, ≦0.02% Cr, ≦0.07% Fe, ≦0.025% Zn, ≦0.06% Si, ≦0.015% Ti, and ≦0.015% total residual elements. Accordingly, the aluminum plating can have a very low total transition metal content, e.g., less than 0.10%, less than 0.05%, less than 0.01% or less than 0.001% by weight of the plating. Consequently, the aluminum plating can at least substantially reduce transition metal contamination of semiconductor material processing chambers containing one or more of the components.

The aluminum plating can be deposited on a substrate or on an intermediate layer by any suitable technique that provides an aluminum plating having the desired purity, structure and physical properties. Preferably, the aluminum plating is deposited by electrodeposition (also called electroplating). Techniques for electrodeposition of aluminum on electrically conductive materials are described in U.S. Pat. Nos. 4,032, 413 and 4,144,140, and techniques for electrolytic deposition of high-purity aluminum are described in U.S. Pat. Nos. 5,007,991 and 5,091,063, the disclosure of each of which is hereby incorporated by reference in its entirety. Interior and/or exterior surfaces that are not to be electroplated can be masked.

Electroplating processes can be used to form an aluminum plating on external and/or internal surfaces that are difficult, or even not possible, to access by some other coating techniques, such as thermal spray techniques. Accordingly, by using electroplating processes to form the wear-resistant coatings, an enhanced number of parts and different part configurations can have the wear-resistant coatings.

The aluminum plating forming the wear-resistant coatings 120, 220, 320 can have a thickness of about 5 µm to about 200 µm, such as about 5 µm to about 20 µm. Preferably, the thickness of the aluminum plating is substantially uniform over the surfaces 112, 212, 312 of the components 100, 200, 300, respectively.

The aluminum plating preferably contains, by volume, less than about 1% porosity, such as less than about 0.5%, 0.1%, or 0.01%, i.e., has a density that approaches the theoretical density of the aluminum. The aluminum plating is preferably also free of defects. A low porosity level can minimize contact of aggressive atmospheres with the underlying substrate. Accordingly, the aluminum plating protects against physical and/or chemical attack of the substrate by such aggressive atmospheres.

The aluminum plating forming the wear-resistant coatings 120, 220, 320 can provide good adhesion strength to the surfaces 112, 232, 312 of the components 100, 200, 300, respectively. The aluminum plating can be formed directly on the substrate 110, 310, or on the intermediate layer 230, with or without having previously roughened the substrate surface 112, 312, respectively, or the intermediate layer surface 232. In a preferred embodiment, the aluminum plating provides suitable adherence to the substrate or intermediate layer without prior roughening of the substrate or intermediate layer, which obviates additional process steps. Preferably, the aluminum plating has a sufficiently-high adhesive bond strength to the surface(s) of a substrate on which the plating is formed such that when a tensile bond strength test is performed on the substrate, the aluminum plating fails cohesively (i.e., in the substrate bulk) and not adhesively (i.e., at the substrate/plating interface).

The adhesion strength of the aluminum plating to a substrate or intermediate layer formed on a substrate can be tested by bending the aluminum-plated substrate through an angle of 180° on a diameter equal to the thickness of the substrate until the substrate fractures. Following fracture, the aluminum plating preferably has a sufficiently-high adhesion strength such that it cannot be detached from the substrate surface or intermediate layer surface with a sharp instrument, and shows no visible separation from the surface under magnification.

The exemplary embodiments of the aluminum-plated component 100, 200, 300 shown in FIGS. 1 to 3 can be used in a resist stripping chamber of a semiconductor material processing apparatus, for example. As described further below, plasma is generated remotely and reactive species are introduced into resist stripping chambers to remove ("strip") resist from substrates. In resist stripping chambers, process gases that are used to remove resist material from substrates can typically include $O_2$, $N_2$, water vapor and fluorocarbons, such as $CF_4$ and the like. These gases are not corrosive with respect to the aluminum plating. Accordingly, the aluminum plating provides corrosion resistance with respect to these gases when used as a process-exposed surface of components in resist stripping chambers.

Other exemplary embodiments of the aluminum-plated component can be used in plasma etch chambers or deposition chambers of semiconductor material processing apparatuses, for example. In these chambers, process-exposed surfaces can be exposed to plasma and/or process gases. In certain etching processes, these process gases can be halogen-containing species, e.g., HBr and Cl, that are corrosive with respect to aluminum surfaces. Anodized aluminum surfaces can, however, be used as process-exposed surfaces to provide corrosion resistance to these gases.

Figure 4:
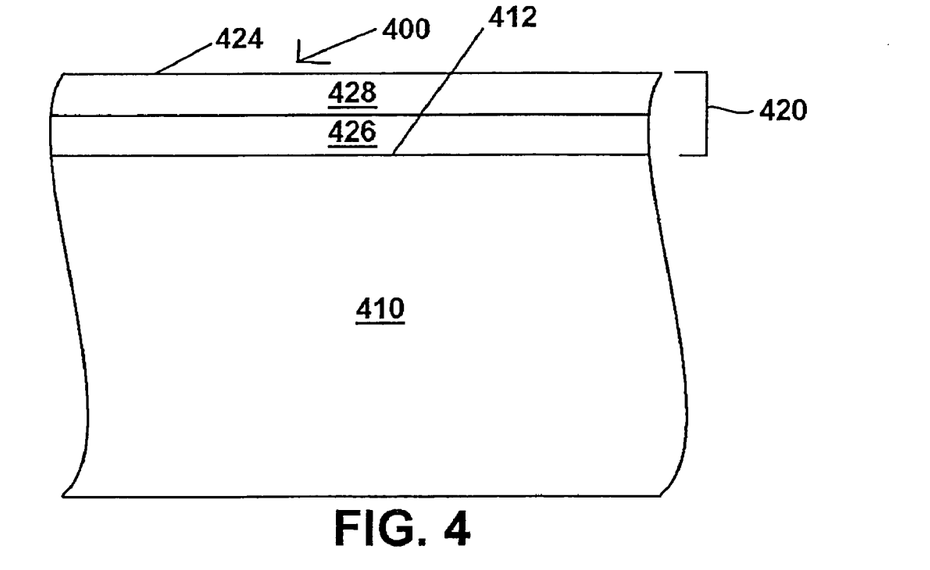
FIG. 4 illustrates another exemplary embodiment of an aluminum-plated component comprising a substrate, an aluminum plating on the substrate, and an anodized layer on the aluminum plating and comprising a process-exposed outer surface of the component.

FIG. 4 illustrates an aluminum-plated component 400 according to another exemplary embodiment that can be used in a plasma etch chamber or material deposition chamber, for example. In the embodiment, the component 400 comprises a substrate 410 and a wear-resistant coating 420 formed on the substrate 410. The wear-resistant coating 420 comprises an aluminum plating 426 formed on the surface 412 of the substrate 410, and an anodized layer 428 formed on the aluminum plating 426 and comprising an outer surface 424 of the component 400. The anodized layer 428 provides resistance to chemical and/or physical attack by plasma and/or corrosive gases (e.g., HBr and Cl) in plasma etch chambers and material deposition chambers.

In the embodiment, the substrate 410 on which the aluminum plating 426 is formed can comprise an electrically-conductive material (such as the substrate 110 shown in FIG. 1); an electrically-conductive material or an electrical insulator on which an electrically-conductive intermediate layer is formed (such as the substrate 210 and intermediate layer 230 shown in FIG. 2); or a substrate comprising a metal outer layer integral with a base portion (such as the substrate 310 shown in FIG. 3).

In the embodiment, the aluminum plating 426 is preferably a high-purity material. Preferably, the aluminum plating 426 comprises at least about 99.00 wt. % aluminum, more preferably at least about 99.99 wt. % aluminum, such as >99.999% aluminum. The aluminum plating can comprise, in weight percent, one or more of the following elements: ≦0.10% Cu, ≦0.10% Mg, ≦0.015% Mn, ≦0.02% Cr, ≦0.07% Fe, ≦0.025% Zn, ≦0.06% Si, ≦0.015% Ti, and ≦0.015% total residual elements. The aluminum plating 426 is preferably plated on the surface 412 of the substrate 410 by electrodeposition.

The anodized layer 428 can be formed on the aluminum plating 426 by any suitable anodizing process. For example, mixed acid and hard anodizing processes can be used. The as-formed anodized layer is porous. Preferably, fluid-accessible pores of the anodized layer 428 are sealed by exposing the anodized surface to hot water or steam, for example, to form AlOOH. The anodized layer 428 preferably has a thickness of at least about 50 µm, such as at least about 75 µm, 100 µm, 200 µm, 300 µm or 400 µm. During anodizing of the aluminum plating, the anodized layer 428 grows from and into the aluminum plating. The aluminum plating is formed on the substrate 410 with a sufficient thickness to allow formation of the anodized layer with a desired thickness. Preferably, the aluminum plating is formed on the substrate 410 with a thickness that is at least about twice the desired thickness of the anodized layer 428.

By forming the anodized layer 428 on the aluminum plating 426, the wear-resistant coating 420 can be used in etch chambers and exposed to gases and/or plasma that could chemically or physically attack the aluminum plating 426 if the aluminum plating 426 comprised a process-exposed surface. When the component 400 is used in such etch chambers, because the aluminum plating can be deposited with minimal impurities, such as transition metals, which are detrimental to the performance and lifetimes of electronic devices manufactured on semiconductor wafers, the contamination of processing chambers and wafers by impurities during wafer processing can be substantially eliminated.

Embodiments of the wear-resistant coatings comprising an aluminum plating comprising a process-exposed surface, and embodiments of the coatings comprising anodized aluminum comprising a process-exposed surface can be formed on metallic substrates that have a transition metal content that may be higher than a maximum acceptable content for a process-exposed surface. The wear resistant coatings can substantially prevent the transition metals from being removed from the substrate by corrosive gases, plasma and/or energetic ions and consequently contaminating a process chamber. For example, the aluminum plating can be formed on non-aluminum metallic surfaces, such as steel and stainless steel surfaces. The aluminum plating can also be formed on aluminum surfaces. For example, 6061 aluminum comprises, in wt. %, aluminum, balance 0.04-0.35% Cr, 0.15-0.4% Cu, ≦0.7% Fe, 0.8-1.2% Mg, ≦0.15% Mn, 0.4-0.8% Si, ≦0.15% Ti, ≦0.25% Zn and ≦0.15 total residual elements. This alloy has good machining and forming characteristics. Some other aluminum alloys, e.g., 1100 aluminum (which comprises, in wt. %, ≧99.6% Al, ≦0.05% Cu, ≦0.35% Fe, ≦0.03% Mg, ≦0.03% Mn, ≦0.25% Si, ≦0.03% Ti, ≦0.05% V, ≦0.05% Zn, and remainder each element≦0.03%), have a lower transition metal content than 6061 aluminum, but have poorer machining characteristics than 6061 aluminum. Forming the wear-resistant coatings on one or more surfaces of a 6061 aluminum substrate, e.g., allows easier machining and forming of component shapes, and use of the aluminum plating minimizes the potential for transition metal contamination of processed wafers.

Figure 5:
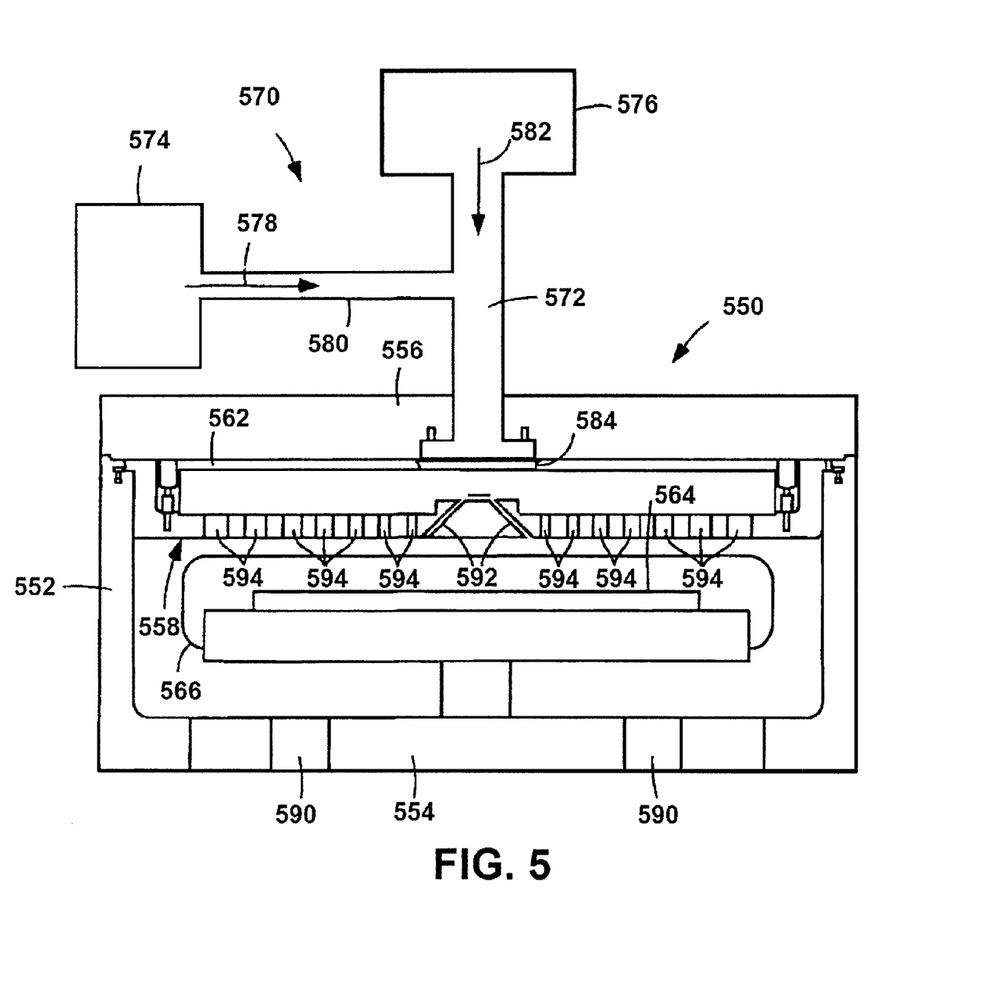
FIG. 5 illustrates an exemplary embodiment of a resist stripping chamber in which embodiments of the aluminum-plated components can be installed.

FIG. 5 depicts an exemplary embodiment of a resist stripping chamber 550 in which one or more components having an aluminum plating comprising an outer surface of the component can be used. The components can have a structure as shown in any one of FIGS. 1 to 3, for example. The resist stripping chamber 550 is described in commonly-owned U.S. Patent Application Publication No. 2005/0284573, which is incorporated herein by reference in its entirety. As shown, the resist stripping chamber 550 includes a side wall 552, bottom wall 554, cover 556, baffle 558, substrate support 560 and liner 562. Any interior surface of the resist stripping chamber 550 that is exposed to process gas and/or reactive species, such as the walls 552 and 554, liner 562, portions of the substrate support 560 and/or baffle 558, can include a protective aluminum plating, as described above. These and other components can comprise an aluminum material on which the aluminum plating is applied.

As shown in FIG. 5, a semiconductor substrate 564, such as a wafer, is supported on the substrate support 560 during resist stripping. The substrate 564 includes a resist that protects underlying layers of the substrate during the resist stripping process. The substrate support 560 can comprise an electrostatic chuck adapted to clamp the substrate 564. The substrate support 564 can include a heater to keep the substrate 564 at a desired temperature during the resist stripping process. For example, the substrate 564 can be maintained at a temperature of about 200° C. to about 300° C. during resist stripping. The substrate 564 can be introduced into and removed from the resist stripping chamber 550 via an entry port 566 in the sidewall 552. The substrate 564 can be transferred under vacuum into the resist stripping chamber 550 from an etching chamber located proximate the resist stripping chamber 550.

In the embodiment, a remote plasma source 570 is arranged in fluid communication with the resist stripping chamber 550. The plasma source 570 produces plasma and supplies reactive species into the resist stripping chamber through a passage 572. The reactive species remove resist from the substrate 564. The illustrated embodiment of the plasma source 570 includes a remote energy source 574 and a process gas source 576. The energy source 574 can be any suitable source and is preferably a microwave generator. Microwaves, represented by arrow 578, are produced by the microwave generator and propagated through a waveguide 580 into the passage 572.

The gas source 576 supplies process gas, represented by arrow 582, into the passage 572, where the gas is energized into the plasma state by the microwaves. Reactive species pass through an opening 584 into the resist stripping chamber 550.

The reactive species are distributed in the resist stripping chamber 550 by the baffle 558 and strip the resist. Waste products generated during resist stripping are pumped out of the resist stripping chamber 550 through exhaust ports 590. The illustrated embodiment of the baffle 558 includes passages 592 through which ultraviolet radiation can pass.

Liner 562 is adapted to minimize the deposition of materials on the bottom surface of the cover 556 during resist stripping processes. The liner 562 can include an aluminum plating comprising the process-exposed bottom surface to provide corrosion protection to the liner 562.

In an exemplary embodiment, the process gas used to produce the remote plasma includes oxygen, which is excited into a plasma state that dissociates $O_2$ into oxygen radicals and ion species, which are flowed into the interior of the resist stripping chamber 550 and react with (i.e., oxidize or "ash") the resist layer on the substrate 564. The rate at which the photoresist is removed by the strip process is referred to as the "strip rate." The process gas can have any suitable composition, such as an oxygen-containing gas mixture, such as an $O_2/N_2$, $O_2/H_2O$, $O_2/N_2/CF_4$, or $O_2/N_2/H_2O$ gas mixture. For example, the gas mixture can comprise $O_2$, $N_2$, and a fluorine-containing component, such as $CF_4$ or $C_2F_6$. $N_2$ can be added to the gas mixture to enhance selectivity with respect to the photoresist material as compared to a second material, such as a barrier and/or underlying material (i.e., the ratio of the photoresist etch rate to the etch rate of the second material).

As described above, in embodiments of the components comprising an aluminum plating and an anodized layer formed on the aluminum plating, the anodized layer provides one or more surfaces that can resist chemical and physical attack and associated levels of particulate contamination in plasma reactor chambers, including deposition and etch chambers. The anodized layer can also protect underlying substrates against both physical attack and chemical attack by plasmas and corrosive gases in such reactor chambers.

The aluminum-plated components including an anodized layer comprising a process-exposed surface can be used in various plasma atmospheres for etching, deposition, cleaning, and other applications. Typical etch chemistries can include, e.g., chlorine-containing gases, such as $Cl_2$, HCl and $BCl_3$; bromine-containing gases, such as $Br_2$ and HBr; oxygen-containing gases, such as $O_2$, $H_2O$ and $SO_2$; fluorine-containing gases, such as $CF_4$, $CH_2F_2$, $NF_3$, $CH_3F$, $C_2F_6$, $CHF_3$ and $SF_6$; and inert and other gases, such as He, Ar and $N_2$. These and other gases may be used in any suitable combination, depending on the desired plasma. Suitable flow rates of the various process gases can be selected based on factors including, but not limited to, the type of plasma reactor, power settings, chamber pressure, plasma dissociation rates, etch chemistries, materials to be etched, and the particular step of the etch process in which the process gas is used.

The aluminum-plated components including an anodized surface comprising a process-exposed surface can be used in etch chambers of semiconductor processing equipment for etching conductors, semiconductors and/or insulators.

The aluminum-plated components including an anodized layer comprising a process-exposed surface can be used as reactor components in a polysilicon high-density plasma reactor, for example. An exemplary reactor of this type is the TCP 9400™ plasma etch reactor available from Lam Research Corporation of Fremont, Calif. In this reactor, processing gases (e.g., $Cl_2$, HBr, $CF_4$, $CH_2F_2$, $O_2$, $N_2$, Ar, $SF_6$ and $NF_3$) are supplied into the reactor chamber.

Another exemplary polysilicon etch reactor is the VersyS™ Polysilicon Etcher or 2300™ etcher, which is also available from Lam Research Corporation of Fremont, Calif. The polysilicon etch reactor includes a substrate support having an electrostatic chuck, and a plasma focus ring is mounted on the substrate support around the electrostatic chuck. The substrate support can also be used to apply an RF bias to the substrate. The substrate can be back-cooled using a heat transfer gas. In the 2300™ etcher, processing gases (e.g., $Cl_2$, HBr, $CF_4$, $CH_2F_2$, $O_2$, $N_2$, Ar, $SF_6$ and $NF_3$) are introduced into the chamber via a gas injector. An inductive coil proximate a dielectric window of the chamber can be powered by a suitable RF source to provide a high-density plasma inside the chamber. A chamber liner surrounds the substrate support, and the chamber can also include suitable vacuum pumping apparatus for maintaining the interior of the chamber at a desired pressure.

Certain reactor components, such as portions of the substrate support, the chamber liner, the focus ring, and/or the electrostatic chuck, can be aluminum-plated components and have anodized layers comprising a process-exposed surface. The wall of the chamber and the substrate support below the chamber liner can also be aluminum-plated components including an anodized layer. Any or all of these components, as well as any other components having a process-exposed surface, can be aluminum-plated components including an anodized layer.

The reactor components can also be used in a high-density oxide etch process. An exemplary oxide etch reactor is the TCP 9100™ plasma etch reactor available from Lam Research Corporation of Fremont, Calif. In the TCP™ reactor, the gas distribution plate is situated directly below the TCP™ window, which is also the vacuum sealing surface at the top of the reactor in a plane above and parallel to a substrate being processed. Process gas is fed from a source into the space defined by the gas distribution plate, an inside surface of the window underlying a flat spiral coil supplying RF energy into the reactor. The gas distribution plate material comprises a dielectric material to enable coupling of this RF power through the gas distribution plate into the reactor.

The oxide etch reactor comprises a plasma chamber that includes a substrate holder having an electrostatic chuck, which provides a clamping force to a substrate and an RF bias to a substrate. The substrate can be back-cooled using a heat transfer gas. A focus ring confines plasma in an area above the substrate. A source of energy for maintaining a high density (e.g., $10^{11}$-$10^{12}$ ions/cm$^3$) plasma in the chamber, such as an antenna powered by a suitable RF source to provide a high density plasma, is disposed at the top of the plasma chamber. The chamber includes suitable vacuum pumping apparatus for maintaining the interior of the chamber at a desired pressure (e.g., below 50 mTorr, typically 1-20 mTorr).

A substantially planar dielectric window is provided between the antenna and the interior of the plasma processing chamber and forms a vacuum wall at the top of the processing chamber. A gas distribution plate is beneath window and includes openings for delivering process gas from the gas supply to the chamber. A conical or cylindrical liner extends from the gas distribution plate and surrounds the substrate holder. The antenna can optionally be provided with a channel through which a heat transfer fluid is circulated via inlet and outlet conduit.

In operation, a semiconductor substrate, such as a silicon wafer, is positioned on the substrate holder and held in place by an electrostatic chuck. Process gas is supplied to the vacuum processing chamber, and a high-density plasma is generated in the space between the substrate and the window by supplying RF power to the antenna.

Various reactor components, such as the chamber liner, the electrostatic chuck, and the focus ring can be aluminum-plated components having an exposed anodized layer.

The high-density polysilicon and dielectric etch chambers described above are only exemplary plasma etch reactors that can incorporate aluminum-plated components having an anodized layer. The components can be used in any etch reactor (e.g., a metal etch reactor), or other type of semiconductor processing equipment where plasma erosion is a problem.

Other aluminum-plated components having an anodized layer can be chamber walls, substrate holders, fasteners, and the like. These parts are typically made from metal (e.g., aluminum) or ceramic (e.g., alumina) and are typically exposed to plasma. Other components may not be directly exposed to plasma, but are exposed to corrosive gases, such as gases emitted from processed wafers or the like. Other equipment used in processing semiconductor substrates can also be aluminum-plated components having an anodized layer. Such equipment can include transport mechanisms, gas supply systems, liners, lift mechanisms, load locks, door mechanisms, robotic arms, fasteners, and the like.

EXAMPLES

Example 1

Coupons of 6061-T6 aluminum having a high-purity aluminum plating comprising at least 99.9% by weight Al were anodized using three different anodization processes I, II and III. An aluminum plating having a thickness of about 250 μm was electrodeposited on each of coupons A, B, C, D and E. Coupons A and B, coupons C and D, and coupon E, respectively, were anodized using the anodization processes I, II and III, respectively.

The anodization process I included the steps of pre-cleaning, deoxidizing, masking, demutting, anodic anodization, post cleaning, hot deionized water sealing, final cleaning, drying and packaging steps. A sulfuric acid bath was used.

The anodization process II included use of an oxalic acid bath.

The anodization process III included use of both oxalic and sulfuric acid (i.e., a mixed acid) in the anodization tank. This process utilizes benefits of oxalic acid (e.g., high ending voltage, but low electrical conductivity) and sulfuric acid (e.g., high conductivity, removes intermetallic particles, use of low temperature to achieve good hardness).

As shown in Table 1, the coupons were tested to determine the breakdown voltage of the anodized films. Coupons C and D (anodization process II) and coupon E (anodization process III) had the highest breakdown voltage values.

TABLE 1

| Breakdown Voltage [kV] | | | | | |
|---|---|---|---|---|---|
| A | 0.99 | 0.99 | 1.03 | 1.13 | 1.29 | 0.97 |
| B | 0.84 | 1.1 | 1.22 | 1.2 | 0.84 | 0.83 |
| C | 1.45 | 1.6 | 1.11 | 1.49 | 1.6 | 1.54 |
| D | 1.6 | 1.57 | 1.6 | 1.56 | 1.145 | 1.49 |
| E | 1.09 | 1.19 | 1.29 | 1.11 | 1.09 | 1.39 |

As shown in Table 2, the anodized layer thickness was measured for the coupons. Coupons A, B, C and D each had a thickness of at least 2 mils (about 50 μm). Coupon D anodized using anodization process II had the highest anodized layer thickness.

TABLE 2

| Anodized Layer Thickness [mil] | | | | | |
|---|---|---|---|---|---|
| | Mean | Min | Max | Standard | Range | Variation |
| A | 2.121 | 1.962 | 2.287 | 0.086 | 0.324 | 4.08% |
| B | 2.097 | 1.962 | 2.191 | 0.068 | 0.229 | 3.23% |
| C | 2.023 | 1.863 | 2.176 | 0.098 | 0.313 | 4.83% |
| D | 2.893 | 2.77 | 2.982 | 0.066 | 0.212 | 2.29% |
| E | 1.778 | 1.612 | 1.921 | 0.089 | 0.31 | 5.02% |

As shown in Table 3, the surface roughness of the anodized layers was measured. For each coupon, arithmetic mean surface roughness measurements were made at six locations on the anodized surface. The surface roughness values for the coupons were similar.

TABLE 3

| Anodized Layer Roughness (micro-inches) | | | | | |
|---|---|---|---|---|---|
| A | 131 | 127 | 126 | 126 | 129 | 120 |
| B | 119 | 112 | 123 | 118 | 121 | 123 |
| C | 117 | 128 | 115 | 115 | 109 | 121 |
| D | 119 | 109 | 106 | 112 | 113 | 107 |
| E | 128 | 113 | 120 | 118 | 110 | 121 |

The coupons were also tested using the HCl bubble test. To perform the bubble test, epoxy was used to mount a poly-glass tube on the anodization of the coupons. After drying, a 5 wt. % HCl solution was filled in the tube. The anodized surface was observed for the appearance of continuous $H_2$ bubble generation from the anodized surface. In the bubble test, when the anodization fails, HCl directly reacts with aluminum to generate $H_2$ bubbles. The time until continuous $H_2$ bubble generation was determined. Each of the coupons did not generate continuous $H_2$ bubbles within 5 hours of testing.

The coupons were also subjected to electrochemical impedance spectroscopy (EIS) testing using a 3.5 wt. % NaCl solution, which is equivalent to sea water. Coupons C and D (anodized using process II) and coupon E (anodized using process III) displayed excellent corrosion resistance, with coupon E showing the best corrosion resistance (highest impedance) according to this testing, and coupons C and D the second highest impedance.

Example 2

Coupons of 6061-T6 aluminum without a high-purity aluminum plating were anodized using the above-described anodization processes I, II and III and subjected to thermal cycling to determine the cracking behavior of the anodized layers. The coupons including an anodized layer formed by the different anodization processes were thermally cycled in two heating zones at temperatures of 80° C. and 200° C. with $N_2$ flow for fifty cycles. After the thermal cycling, the anodized surfaces were analyzed at random locations using a scanning electron microscope (SEM) at magnifications of 200× and 1000×. Micrographs at 1000× and 2000× were also taken of observed cracks.

The anodized layers formed by the anodization process III (mixed oxalic acid and sulfuric acid bath) displayed the highest density (lowest porosity) based on having the lowest number of surface cracks. The anodized layers formed by the anodization process III displayed about ten times less surface cracks (about ten times higher density) than the anodized layers formed by the anodization process I (sulfuric acid bath). The anodized layers formed by the anodization process II displayed large cracks after thermal processing.

While the invention has been described in detail with reference to specific embodiments thereof, it will be apparent to those skilled in the art that various changes and modifications can be made, and equivalents employed, without departing from the scope of the appended claims.

What is claimed is:

1. An aluminum-plated component of a resist stripping chamber of semiconductor material processing apparatus, the component comprising:
    a substrate including at least a first surface;
    an optional intermediate layer on at least the first surface of the substrate, the intermediate layer including at least a second surface;
    a high-purity, electrodeposited aluminum plating on the first surface of the substrate or on the second surface of the optional intermediate layer, wherein the first surface or the second surface on which the aluminum plating is disposed is an electrically-conductive surface, and the aluminum plating comprises a process-exposed outer surface of the component, and
    wherein the aluminum plating comprises, in wt. %, at least 99.00% Al, Cu≦0.10%, Mg≦0.10%, Mn≦0.015%, Cr≦0.02%, Fe≦0.07%, Zn—0.025%, Si≦0.06%, Ti≦0.015%, and ≦0.015% total other residual elements.

2. The aluminum-plated component of claim 1, wherein the aluminum plating comprises at least 99.99 wt. % Al and ≦0.01 wt. % total transition elements, and has a thickness of about 5 μm to about 200 μm.

3. The aluminum-plated component of claim 1, wherein:
    the substrate comprises aluminum or an aluminum alloy, electrically-conductive ceramic material or electrically-conductive polymeric material; and
    the aluminum plating is on the first surface of the substrate.

4. The aluminum-plated component of claim 1, wherein:
    the substrate comprises an electrical insulator;
    the intermediate layer is a metal layer on the first surface of the substrate;
    the aluminum plating is on the second surface of the intermediate layer.

5. The aluminum-plated component of claim 1, wherein:
    the substrate comprises a base portion and an outer portion of a metallic material integral with the base portion and including the first surface, the base portion comprises a mixture of at least one ceramic material and at least one metal oxide; and
    the aluminum plating is on the first surface of the outer portion.

6. The aluminum-plated component of claim 1, wherein the substrate comprises a ceramic material selected from the group consisting of yttria, alumina, quartz, zirconia, silicon carbide, titania, silicon nitride, boron carbide, boron nitride, aluminum nitride, and mixtures thereof and
the component includes the intermediate layer and/or the ceramic material is electrically-conductive.

7. A semiconductor material processing apparatus, comprising:
a resist strip chamber;
a remote plasma source in fluid communication with the resist stripping chamber and operable to supply reactive species into the resist stripping chamber; and
at least one aluminum-plated component according to claim 1 disposed in the resist strip chamber;
wherein the first and second surfaces of the aluminum-plated component comprise a non-aluminum material.

8. A method of removing resist from a semiconductor substrate disposed in the resist stripping chamber of the apparatus according to claim 7, comprising:
supplying reactive species from the remote plasma source into the resist stripping chamber containing a semiconductor substrate having resist thereon; and
selectively removing the resist from the semiconductor substrate with the reactive species.

9. An aluminum-plated component of a semiconductor material processing apparatus, comprising:
a substrate including at least a first surface;
an optional intermediate layer on at least the first surface of the substrate, the intermediate layer including at least a second surface;
a high-purity, aluminum plating on the first surface of the substrate or on the second surface of the optional intermediate layer, wherein the first surface or the second surface on which the aluminum plating is disposed is electrically-conductive; and
an anodized layer formed on the aluminum plating, the anodized layer comprising a process-exposed outer surface of the component, and
wherein the aluminum plating comprises, in wt. %, at least 99.00% Al, Cu≦0.10%, Mg≦0.10%, Mn≦0.015%, Cr≦0.02%, Fe≦0.07%, Zn≦0.025%, Si≦0.06%, Ti≦0.015%, and ≦0.015% total other residual elements.

10. The aluminum-plated component of claim 9, wherein the aluminum plating is an electrodeposited aluminum layer comprising at least 99.99 wt. % Al and ≦0.01 wt. % total transition elements, and has a thickness of about 5 μm to about 200 μm.

11. The aluminum-plated component of claim 9, wherein:
the substrate comprises aluminum or an aluminum alloy, electrically-conductive ceramic material or electrically-conductive polymeric material; and
the aluminum plating is on the first surface of the substrate.

12. The aluminum-plated component of claim 9, wherein:
the substrate comprises an electrical insulator;
the intermediate layer is a metal layer on the first surface of the substrate; and
the aluminum plating is on the second surface of the intermediate layer.

13. The aluminum-plated component of claim 9, wherein:
the substrate comprises a base portion and an outer portion of a metallic material integral with the base portion, the outer portion including the first surface; and
the aluminum plating is on the first surface of the outer portion.

14. The aluminum-plated component of claim 9, wherein the substrate comprises a ceramic material selected from the group consisting of yttria, alumina, quartz, zirconia, silicon carbide, titania, silicon nitride, boron carbide, boron nitride, aluminum nitride, and mixtures thereof.

15. A semiconductor material processing apparatus, comprising:
a plasma processing chamber;
a process gas source in fluid communication with the plasma processing chamber for supplying a process gas into the plasma processing chamber;
an RF energy source adapted to energize the process gas into the plasma state in the plasma processing chamber; and
one aluminum-plated component according to claim 9 in the plasma processing chamber;
wherein the aluminum-plated component is selected from the group consisting of a chamber wall, chamber liner, substrate support, baffle, gas distribution plate, plasma confinement ring, nozzle, fastener, heating element, plasma focus ring, chuck and a plasma screen.

16. A method of plasma etching a semiconductor substrate in the apparatus according to claim 15, comprising:
supplying the process gas from the process gas source into the plasma processing chamber;
applying RF energy to the process gas using the RF energy source to generate plasma in the plasma processing chamber; and
plasma etching a semiconductor material, insulator or metallic material on a substrate in the plasma processing chamber.

* * * * *